US 11,485,238 B2

(12) United States Patent
Foley et al.

(10) Patent No.: US 11,485,238 B2
(45) Date of Patent: Nov. 1, 2022

(54) REDUNDANT BATTERY MANAGEMENT SYSTEM ARCHITECTURE

(71) Applicant: Zoox, Inc., Foster City, CA (US)

(72) Inventors: Kyle Matthew Foley, Half Moon Bay, CA (US); Robert Alan Ng, Mountain View, CA (US); Moritz Boecker, Millbrae, CA (US); Chong Zhang Tao, Folsom, CA (US); Vincent Richard Tannahill, San Mateo, CA (US); Efren Alonzo Cabebe, Emeryville, CA (US); Derek Redfern, San Francisco, CA (US)

(73) Assignee: Zoox, Inc., Foster City, CA (US)

( * ) Notice: Subject to any disclaimer, the term of this patent is extended or adjusted under 35 U.S.C. 154(b) by 0 days.

(21) Appl. No.: 17/215,236

(22) Filed: Mar. 29, 2021

(65) Prior Publication Data
US 2021/0213838 A1    Jul. 15, 2021

Related U.S. Application Data

(63) Continuation of application No. 16/104,310, filed on Aug. 17, 2018, now Pat. No. 10,960,776.

(51) Int. Cl.
*B60L 50/64* (2019.01)
*G01R 31/392* (2019.01)
(Continued)

(52) U.S. Cl.
CPC .............. *B60L 50/64* (2019.02); *B60L 58/24* (2019.02); *G01R 31/3842* (2019.01); *G01R 31/392* (2019.01)

(58) Field of Classification Search
CPC .......... B60L 50/64; B60L 58/24; B60L 58/18; G01R 31/3842; G01R 31/392
(Continued)

(56) References Cited

U.S. PATENT DOCUMENTS 7,576,501 B2 *  8/2009  Okubo ................... B60K 6/445
                                                290/40 C
7,750,505 B2    7/2010  Ichikawa
(Continued)

FOREIGN PATENT DOCUMENTS

EP          2330712 A1      6/2011

OTHER PUBLICATIONS

Non Final Office Action dated Aug. 25, 2020 for U.S. Appl. No. 16/104,310, "Redundant Battery Management System Architecture", Foley, 6 pages.
(Continued)

*Primary Examiner* — David Luo
(74) *Attorney, Agent, or Firm* — Lee & Hayes, P.C.

(57) ABSTRACT

A vehicle can include a battery architecture configured to provide electrical power to motors, accessories, and other components of the vehicle. The architecture can include a controller coupled to multiple battery units. Each battery unit can include a battery and a battery management system. Additionally, each battery unit can be coupled to a controller and to other battery units. Through the use of redundant coupling and redundant data transmitted to and from the controller, battery units, and other components, the architecture can detect a fault and continue to operate while providing an indication of the fault.

17 Claims, 7 Drawing Sheets

(51) Int. Cl.
*G01R 31/3842* (2019.01)
*B60L 58/24* (2019.01)

(58) Field of Classification Search
USPC .................................................. 318/139, 558
See application file for complete search history.

(56) References Cited

U.S. PATENT DOCUMENTS

| | | | |
|---|---|---|---|
| 8,115,453 | B2 | 2/2012 | Houldsworth et al. |
| 8,410,755 | B2 * | 4/2013 | Chau ...................... B60L 50/64 |
| | | | 320/134 |
| 8,463,563 | B2 | 6/2013 | Tae et al. |
| 9,325,192 | B2 * | 4/2016 | Fukui ...................... B60L 58/15 |
| 9,641,106 | B2 | 5/2017 | Ota et al. |
| 10,483,841 | B2 | 11/2019 | Tsujii |
| 2013/0009648 | A1 | 1/2013 | Tae |
| 2013/0108898 | A1 | 5/2013 | Potts et al. |
| 2013/0154572 | A1 | 6/2013 | Ito |
| 2016/0099585 | A1 | 4/2016 | Song |
| 2018/0111599 | A1 | 4/2018 | Wang et al. |
| 2020/0055407 | A1 | 2/2020 | Foley et al. |

OTHER PUBLICATIONS

The PCT Search Report and Written Opinion dated Nov. 14, 2019, for PCT Application No. PCT/US2019/046844, 10 pages.
Extended European Search Report dated Mar. 28, 2022 for European Patent Application No. 19850554.7, 9 pages.

* cited by examiner

400 ⤴

408 ⤴

REDUNDANT BATTERY MANAGEMENT SYSTEM ARCHITECTURE

CROSS REFERENCE TO RELATED APPLICATIONS

This is a continuation application which claims priority to commonly assigned, co-pending U.S. patent application Ser. No. 16/104,310, filed Aug. 17, 2018. Application Ser. No. 16/104,310 is fully incorporated herein by reference.

BACKGROUND

A vehicle can use batteries to provide energy to operate the vehicle. Operations can include providing electrical power to one or more electric motors, sensors, accessories available for use by passengers of the vehicle, and/or other vehicle systems. In order for the vehicle to operate reliably, some or all of these vehicle systems rely on a reliable supply of battery power. However, during the course of operation, degradation of performance or failures can occur, leaving the vehicle significantly limited or inoperable. For example, in some conventional battery system architectures, failure of a battery, a battery controller, or a coupling to a battery can result in an inoperable system or vehicle.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
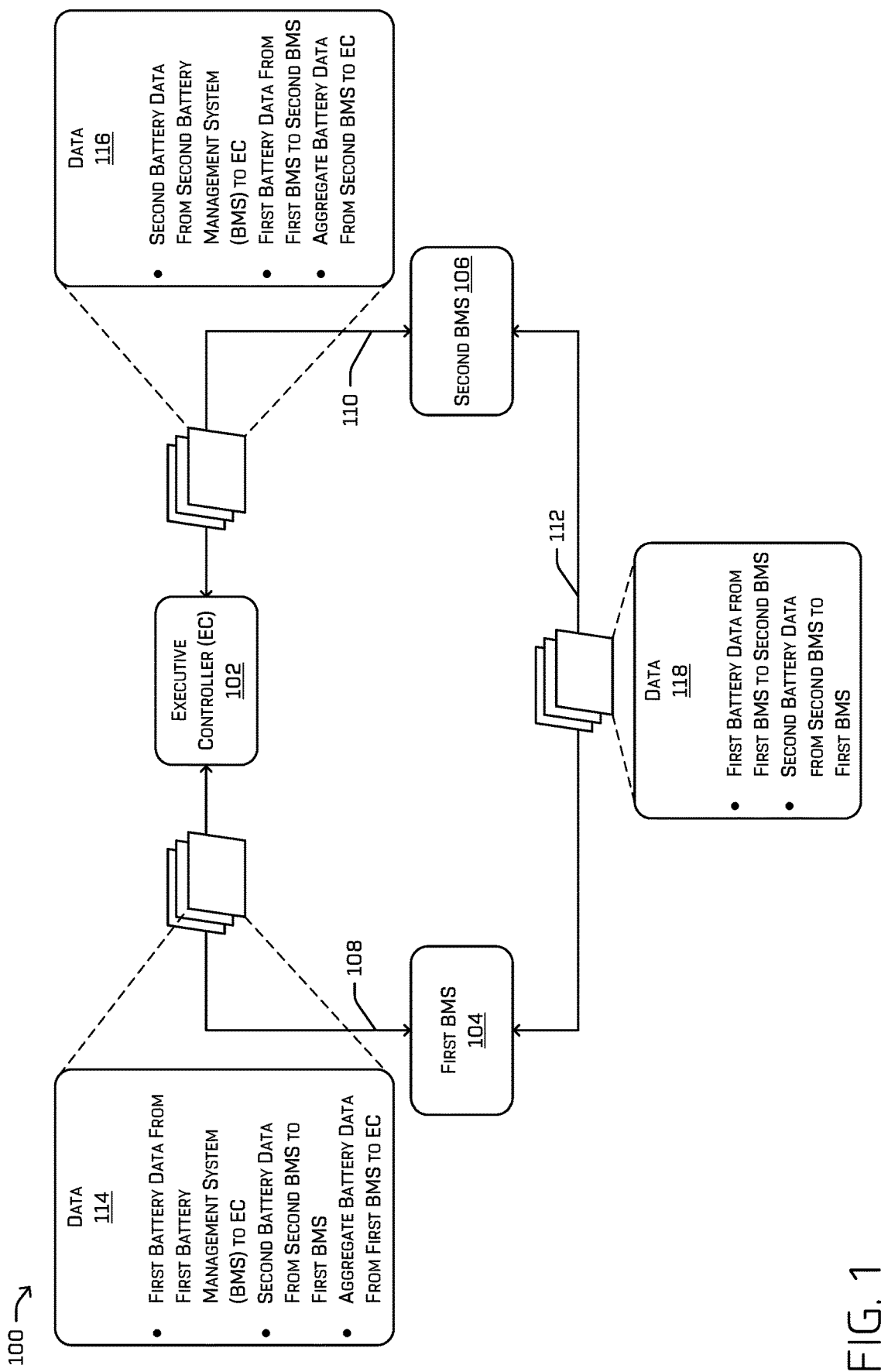
FIG. 1 depicts an example architecture of a redundant battery management system (BMS) architecture.

This disclosure describes systems, methods, and apparatuses for providing a redundant battery management system (BMS) architecture (e.g., a communication architecture) in a vehicle. As discussed above, conventional battery system architectures can result in an inoperable vehicle in some fault conditions. For example, in a conventional battery system architecture, the failure of a battery, a battery controller, a communication link therebetween, or a coupling to a battery can cause a failure of the entire system. Such architectures may be unsuitable for autonomous vehicles or any other type of electrically powered device or system that requires a certain degree of robustness.

This disclosure is generally directed to systems, methods, and apparatuses for a redundant BMS architecture, e.g., a communication architecture. In some instances, a system for providing a redundant BMS architecture can include one or more controllers used to issue commands to other components (e.g., adjust a load connected to the output, such as set torques of motor controllers, connect or disconnect a battery, etc.), communicate states or parameters of one or more components (e.g., a battery), as well as determine if a fault condition has occurred in the system. The controller(s) can also be configured to provide indications of a fault. In some instances, the controller can calculate a capacity or a limit of the system (e.g., a maximum number of current or power provided by one or more batteries) based on data received from other components.

The redundant BMS architecture of this disclosure can also include a first battery unit and a second battery unit, though any number of units is contemplated. In some instances, each battery unit can contain a battery and a BMS. The battery can store energy for use by the redundant BMS architecture and/or an electrical load. The BMS can monitor the status of the battery and/or the battery unit including, but not limited to, a state of charge, a voltage level, a current draw, a power level, an internal resistance, and the like. Additionally, the BMS can be configured to transmit and receive battery data as well as receive operational commands.

In some instances, the redundant BMS architecture can be implemented such that the controller is electrically and/or communicatively coupled by a coupling to the first battery unit and/or the second battery unit. The coupling can allow the controller to communicate with the first battery unit and/or the second battery unit. In some instances, the controller can transmit operational commands to the first battery unit and/or the second battery unit. For example, such a command may comprise either an "ON" or "OFF" designation such that the BMS of the battery unit appropriately connects or disconnects the battery to a common line (which may be for charging or discharging over a load). In some instances, the controller can transmit other operational commands as needed for operation of the vehicle or device. As several non-limiting examples, such commands may comprise a drive command (e.g., sending a torque request to motor controllers), a braking command, a sleep command, etc. In some instances, the controller can transmit battery data to the first battery unit and/or the second battery unit. The battery data can include current limit data, power limit data, voltage limit data, temperature data, connection data, a battery state, a system state, or a battery status, though any other information regarding a parameter of the battery is contemplated. In some instances, the battery data can include impedance data (such as internal resistance) or other data related to the battery.

In some instances, the battery data can include aggregate battery data. In some examples, the aggregate battery data can represent a current that can be provided by battery units in the power system, for example, as an aggregate battery limit. To generate and/or calculate the aggregate battery data, the BMS architecture can include redundant communication pathways for data to be exchanged between various components of the vehicle. For example, in some instances, the second battery unit can transmit second battery data to the controller and to the first battery unit, the controller can transmit the second battery data to the first battery unit, and the first battery unit can transmit first battery data to the controller. The first battery unit can use the second battery data to generate and/or calculate first aggregate battery data and transmit the first aggregate battery data to the controller. In some instances, the transmission of data can occur concurrently and/or in different order without affecting the operation of the system. In some instances, the second battery unit can use the first battery data to transmit second aggregate battery data to the controller. In some instances, the controller can receive first aggregate battery data and/or second aggregate battery data. In some instances, the controller can compare the first aggregate battery data and the second aggregate battery data and select the lower aggregate battery data, the higher aggregate battery data, or either aggregate battery data if the first aggregate battery data and the second aggregate battery data are substantially similar. In some instances, the controller can select the lower aggregate battery data to operate in a conservative configuration to prevent, for example, damage to a component of the system. In other instances, the controller can select the higher aggregate battery data to operate in a higher performance configuration. Operations of a vehicle component, such as a drive motor, can be controlled in accordance with the aggregate battery data.

In some instances, the battery unit can transmit a state or status of one or more of the battery unit, the battery, the BMS, or the system to the controller. The states can be a sleep state, a standby state, a driving state, a charging state, or a shutdown fault state. In some instances, other states can be implemented as needed. The status can be an "okay" status (e.g., a normal operating status), a "do not start" status (e.g., a low-level fault that can indicate, in some instances, a single point fault that does not impact performance or safety), an "end mission" status (e.g., a medium-level fault that can indicate, in some instances, a fault that can impact performance and/or safety operation persists beyond a threshold operation), or a "stop immediately" status (e.g., a high-level fault that can, in some instances, disable continued operation). In some instances, other statuses can be implemented as needed.

In some instances, the first battery unit can be coupled to the second battery unit. In such an instance, the controller can be coupled to the first battery unit and the second battery unit and each battery unit can be coupled to the other battery unit. In some instances, the first battery unit can transmit first battery data to the second battery unit without transmitting the first battery data to the controller. In some instances, the first battery unit can transmit first battery data to the second battery unit by directly transmitting to the second battery unit as well as through the controller. In such an instance, the second battery unit can receive the first battery data from the first battery unit as well as from the controller.

In some instances, the redundant BMS architecture can include a third battery unit or more battery units. In such an implementation, the controller can be coupled to each battery unit in the BMS architecture such as in a hub-and-spoke topology. In other instances, the controller can be coupled to a subset of the available battery units. In some instances, the controller can be coupled to each battery unit and each battery unit can be coupled to every other battery unit such as in a full mesh topology. In other instances, the controller can be coupled to a subset of the available battery units and some of the battery units can be coupled to some or all of the other available battery units. In some instances, all battery units and any one or more controllers may be connected as a ring and pass relevant information (including aggregates) through the ring such that any one component (BMS or controller) may perform any check with respect to faults, limits being exceeded, or the like. As discussed above, the controller can transmit operational commands as well as transmit and receive battery data. Additionally, the battery units can transmit and receive battery data.

The methods, apparatuses, and systems described herein can be implemented in a number of ways. Example implementations are provided below with reference to the following figures. Although discussed in the context of an autonomous vehicle, the methods, apparatuses, and systems described herein can be applied to a variety of systems using electrical power, and is not limited to autonomous vehicles. In another example, the methods, apparatuses, and systems may be utilized in an aviation or nautical context.

FIG. 1 depicts an example architecture 100 implementing a redundant BMS architecture. As shown in the figure, the architecture 100 includes an executive controller (EC) 102 (also referred to as a controller). In some instances, multiple controllers can be used. The EC 102 can be coupled to a first BMS 104 and a second BMS 106. Although not shown in FIG. 1, the first BMS 104 can be included in a battery unit along with a battery or can be included separately from the battery unit. Similarly, the second BMS 106 can be detached from a second battery unit or placed within the second battery unit. In some instances, the first BMS 104 and the second BMS 106 can be placed within the same battery unit. In some instances, any number of BMS units can be used, although in general, one BMS can be used to monitor and/or control a single battery unit. The EC 102 can be coupled to the first BMS 104 through a first coupling or a first drive controller area network (CAN) 108. The EC 102 can also be coupled to the second BMS 106 through a second coupling or a second drive CAN 110. The redundant BMS architecture 100 can also implement a coupling or an interpack CAN 112 coupling the first BMS 104 to the second BMS 106.

As shown in FIG. 1, the first BMS 104 can be coupled to the EC 102 via the first drive CAN 108. Additionally, the second BMS 106 can be coupled to the EC 102 via the second drive CAN 110. In such a case, the first BMS 104 can transmit data 114 to the EC 102 via the first drive CAN 108. In some instances, the data 114 can include first battery data from the first BMS 104 to the EC 102. Additionally, using the second drive CAN 110, the second BMS 106 can transmit data 116 to the EC 102. The EC 102 can be configured to transmit the first battery data to the second BMS 106 and transmit the second battery data to the first BMS 104.

The first battery data and/or the second battery data can comprise data such as limit data. In some instances, a battery unit, a battery, or a BMS can have an operating limit or a maximum limit. The operating limit can indicate a limit that would typically not be surpassed while operating under normal conditions. A maximum limit could indicate a maximum before damage or failure occurs. The types of limits can include current limits, power limits, voltage limits, operational limits, and the like.

The first battery data and/or the second battery data can also include connection data. In some instances, via communication protocols, the first BMS 104 and/or the second BMS 106 can detect data loss and/or corruption. The first BMS 104 and/or the second BMS 106 can transmit this information as connection data to the EC 102 or to other BMS units and/or components.

The first battery data and/or the second battery data can also include a state and/or a status. The state can be a system state, battery state, a BMS state and/or a battery unit state. The states can include a sleep state (e.g., the battery is not providing power and the vehicle is inactive), a standby state (e.g., the battery is ready to provide power and waiting for further instructions), a driving state (e.g., the battery is providing power and/or is actively responding to maneuvering commands), a charging state (e.g., the battery is receiving electrical power), and/or a shutdown fault state (e.g., the battery has shut down due to a fault as is waiting for assistance, attention, and/or maintenance). In some instances, other states can be implemented. Additionally, the status can be a battery status, a BMS status and/or a battery unit status. The statuses can include an "okay" status, a "do not start" status, an "end mission" status, and/or "a stop immediately" status, as described above. In some instances, other states can be implemented.

The first battery data and/or the second battery data can also include impedance data. The impedance data can be real-time impedance data that has been measured or determined by the first BMS 104 and the second BMS 106, respectively. In some instances, the impedance data can be static data based on an initial configuration of a battery, BMS, or battery unit (e.g., by using a lookup table based on, for example, temperature, state of charge, current draw, or the like).

In some instances, the first BMS 104 can be configured to determine a first aggregate battery data and transmit the first aggregate battery data to the EC 102. Additionally, in some instances, the second BMS 106 can be configured to determine a second aggregate battery data and transmit the second aggregate battery data to the EC 102. The first aggregate battery data and/or the second aggregate battery data can include any combination of data or calculation(s) of data including any of the battery data described above. In some instances, the first aggregate battery data can include a first aggregate current limit (e.g., a first aggregate limit). In some instances, the second aggregate battery data can include a second aggregate current limit (e.g., a second aggregate limit). Such current limits may be indicative of, for example, the limit of current which can be delivered by the combined battery sources. In some instances, the first aggregate current limit can comprise a sum of the first current limit and the second current limit. In some instances, the first aggregate current limit can comprise a table lookup based on a characterization of the batteries and using any one or more of a temperature, voltage, state of charge, or current limits as lookup values to the table. In some instances, the first aggregate current limit can comprise a dynamic current limit based on the impedance data or the current data determined by the first BMS 104 and/or the second BMS 106. In some examples, such a dynamically limit may be based on, for example, a feedback loop comprising observed characteristics of the first battery. In some instances, the observed characteristics can include an impedance, a slew rate, and/or an overshoot of the first battery. Such aggregate limits may be similarly calculated by the second BMS 106.

The first BMS 104 can also be configured to transmit data 118 to the second BMS 106 using the interpack CAN 112. Additionally, the second BMS 106 can be configured to transmit data 118 to the first BMS 104 using the interpack CAN 112. The data can comprise similar data as data 114 and data 116 transmitted by the first BMS 104 and the second BMS 106 respectively.

In some instances, the redundant BMS architecture 100 can provide a certain degree of fault tolerance. By way of example, the interpack CAN 112 can be severed, resulting in an inability of the first BMS 104 to transmit data to the second BMS 106 directly using the interpack CAN 112. However, the data 118 sent along interpack CAN 112 is substantially similar to the data 114 sent along the first drive CAN 108. As illustrated in FIG. 1, portions of data 114 are then sent via the second drive CAN 110 to the second BMS 106. As such, all components (the first and second BMSs 104, 106 and the EC 102) all have the same data as if the interpack CAN 112 hadn't been severed. Therefore, in this illustration, the redundant BMS architecture 100 can continue normal operation. However, as the first BMS 104 is no longer able to receive the data 118 from the second BMS 106, the aggregate limit calculated by the first BMS 104 would be lower than an actual aggregate. Because of, for example, this difference, the EC 102 could determine a fault condition, in this illustration, that the interpack CAN 112 is severed, and, in some instances, generate an indication of the fault condition.

By way of another example, either of the first drive CAN 108 or the second drive CAN 110 can be severed (or otherwise damaged), resulting in an inability of the second BMS 106 to transmit data to the EC 102 directly using the second drive CAN 110. The data 118, however, sent along the interpack CAN 112 is substantially similar to the data 116 sent along the second drive CAN 110. Therefore, in this illustration, the redundant BMS architecture 100 can continue normal operation. As above, differences in aggregate limits from the first and second BMSs 104, 106 received by the EC 102 may be indicative of such a fault and the EC 102 may respond accordingly.

Figure 2:
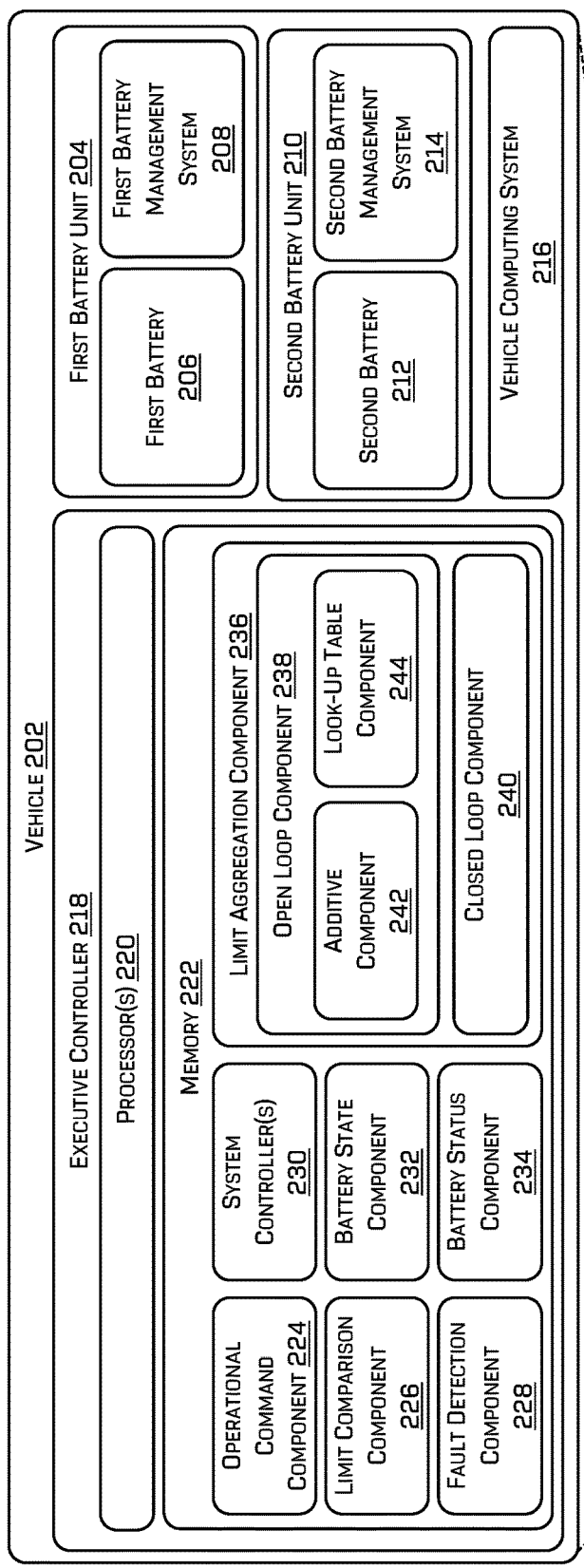
FIG. 2 depicts an example system for implementing a redundant BMS architecture as well as an example environment of a vehicle maneuvering toward a recharging station.
Figure 2:
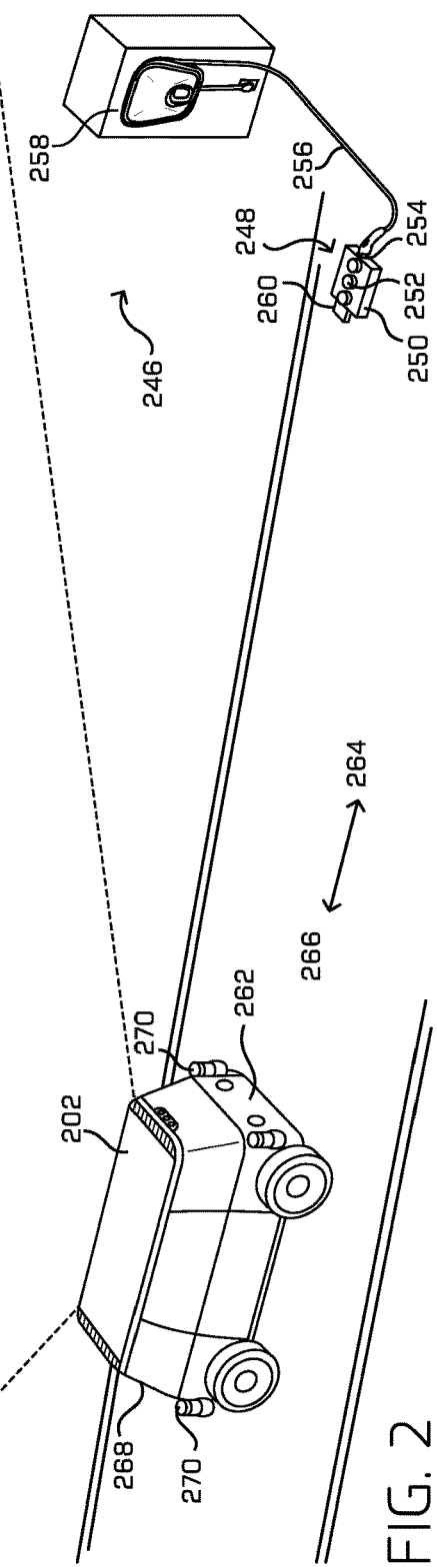

FIG. 2 depicts an example system 200 for implementing a redundant BMS architecture as well as an example environment of a vehicle 202 maneuvering toward a recharging station. The vehicle 202 may be any configuration of vehicle, such as, for example, a sedan, a van, a sport utility vehicle, a cross-over vehicle, a truck, a bus, an agricultural vehicle, and a construction vehicle. The vehicle 202 may be powered by one or more electric motors, one or more internal combustion engines, any combination thereof (e.g., a hybrid power train), and/or any other suitable electric power sources. For the purpose of illustration, the vehicle 202 is an at least partially electrically powered vehicle having two battery units configured to provide the vehicle 202 with electrical power.

The vehicle 202 can include a first battery unit 204 which can comprise a first battery 206 and a first battery management system (BMS) 208. In some instances, the first battery unit 204 can be communicatively coupled to a second battery unit 210. The second battery unit 210 can comprise a second battery 212 and a second BMS 214.

In some instances, the vehicle 202 can include an vehicle computing system 216. The vehicle computing system 216 can be communicatively coupled to the first battery unit 204 and/or the second battery unit 210, in accordance with the discussion provided in FIG. 1.

The vehicle 202 can also include an executive controller 218 which can include processor(s) 220 and memory 222 communicatively coupled to processor(s) 220. In some instances, the executive controller 218 or components within the executive controller 218 can be implemented within the vehicle computing system 216. In other instances, the vehicle computing system 216 can be implemented within the executive controller 218. In some instances, components within the executive controller 218 can be implemented within the first battery management system 208 and/or the second battery management system 214.

In the illustrated example, the memory 222 of the executive controller 218 stores an operational command component 224, a limit comparison component 226, a fault detection component 228, system controller(s) 230, a battery state component 232, a battery status component 234 and a limit aggregation component 236. Although discussed in the context of the memory 222, the executive controller 218 may include a processor and memory that may implement one or more of the components 224, 226, 228, 230, 232, 234, and 236. In some instances, the executive controller can comprise the processor(s) 220 and the memory 222.

The operational command component 224 can be configured to generate commands transmitted by the executive controller 218. The commands can be, in some instances, a shutdown command, a drive command, a charge command, or a sleep command. The executive controller 218, can be communicatively coupled to the first battery unit 204 and/or the second battery unit 210 and transmit the commands to the first battery unit 204 and/or the second battery unit 210.

The limit comparison component 226 can compare limits received at the executive controller 218. As discussed above, the first battery management system 208 can transmit first battery data to the executive controller 218 and the second battery management system 214 can transmit second battery data to the executive controller 218. The first battery data and the second battery data can include operational data such as temperature data and/or first limit data and second limit data, respectively, such as current limit data, power limit data, and/or voltage limit data. In at least some examples, such limit data comprises aggregate limits calculated by each of the first and second BMSs 208, 214 based on the limit of their own battery, as well as limits received from the other BMS. In other examples, such aggregates may be determined by the executive controller 218 based on data of the first and second batteries 206, 212 sent by the BMSs 208, 214. The limit comparison component 226 can compare the values of the first limit data (e.g. first aggregate data) and the second limit data (e.g. second aggregate data) and determine which has a higher or a lower value. In at least some examples, the executive controller 218 may choose the lower value so as to provide a conservative operating limit, ensuring that neither battery will overcurrent, or that the system will generally be able to provide the power required. Vehicle 202 can be an autonomous vehicle and in some instances, vehicle 202 can use the limit data to determine a trajectory of the vehicle 202 and/or adjust a driving characteristic/behavior of the vehicle 202.

The fault detection component 228 can determine a fault in the system based at least in part on the battery data received from the respective BMSs. In some instances, the fault detection component 228 can use battery data such as real-time current data to detect a fault. By way of example, if the first battery management system 208 transmits battery data including real-time current data that exceeds a normal operating threshold, then the fault detection component 228 can determine that a fault has occurred, identify a type of fault as a current overdraw fault, and/or generate an indication of the fault. In some instances, the fault detection component 228 can use battery data such as the limit data to detect a fault. By way of example, if the first battery management system 208 transmits battery data including a current limit at a value below a normal operating threshold, then the fault detection component 228 can determine that a fault has occurred, identify a type of fault as a current limit fault, and/or generate an indication of the fault. Additionally, for purposes of illustration, the fault detection component 228 can use a battery state such as a shutdown fault state within the battery data. The fault detection component 228 can then determine that a fault has occurred, identify a type of fault as a shutdown fault state associated with a particular battery, and/or generate an indication of the fault.

The system controller(s) 230 can be configured to control steering, propulsion, braking, safety, emitters, communication, and other systems of the vehicle 202. The system controller(s) 230 can communicate with and/or control corresponding systems such as drive module and/or other components of the vehicle 202 such as the executive controller 218. In some instances, the executive controller 218 can program and assign system controller(s) 230 and work in conjunction with one another.

The battery state component 232 can monitor and/or update the state of the first battery unit 204 and/or the second battery unit 210. In some instances, the first battery unit 204, at the first battery management system 208, can receive a command from the executive controller 218. Based on the current state of the first battery unit 204, the command received by the executive controller 218, and/or present conditions (e.g., temperature, charge level, etc.), the battery state component 232 can update the state of the first battery unit 204. For purposes of illustration, if the current state of the first battery unit 204 is a driving state and the executive controller 218 transmits a charge command to the first battery unit 204 where it is received at the first battery management system 208, the battery state component 232 can change the current state of the first battery unit 204 from a driving state to a charging state.

The battery status component 234 can monitor and/or update the status of the first battery 206 and/or the second battery 212. In some instances, the first battery 206 can indicate a normal status and the battery status component 234 can, via the first battery management system 208, broadcast an "okay" status. In some instances, the first battery management system 208 can broadcast a "do not start" status, an "end mission" status, and/or a "stop immediately" status. The different statuses can inform other components such as the executive controller 218 of an operational status of a battery and thus allow the executive controller 218 to adjust drive operations based on the status of the battery or batteries.

The limit aggregation component 236 can provide different methods of generating and/or calculating the aggregate data. In some instances, the limit aggregation component 236 can be implemented in the first battery unit 204 and/or the second battery unit 210. Additionally, the limit aggregation component 236 can be implemented in the vehicle computing system 216. Depending on the implementation, the limit aggregation component 236 can be implemented in all or some of the executive controller 218, the first battery unit 204, the second battery unit 210, the vehicle computing system 216, and/or additional battery units. In some instances, the limit aggregation component 236 can include an open loop component 238 and/or a closed loop component 240, with the open loop component 236 including an additive component 242 and/or a look-up table component 244. In some case, the aggregate data can be based on first battery data and second battery data. In some instances, first battery data can include a first current limit associated with the first battery 206 and second battery data can include a second current limit associated with the second battery 212.

The additive component 242 can calculate aggregate data by using additive properties. By way of example, the additive component 242 can sum the value of the first current limit and the value of the second current limit to generate an aggregate current limit. For example, if a first current limit associated with the first battery 206 is 50 A and the second current limit associated with the second battery 212 is 60 A, the additive component 242 can generate an aggregate limit of 110 A. In some instances, the additive component 242 can calculate the aggregate current limit using a weighted sum. For example, the first battery 206 can have an associated first current limit of 100 A with a weight of 0.70 and the second battery 212 can have an associated second current limit of 200 A with a weight of 0.30, and thus the additive component 242 can generate an aggregate current limit of ((100 A*0.80)+(200 A*0.30))=140 A.

The look-up table component 244 can use a database with entries where, in some instances, the first current limit and the second current limit function as a key or a reference to another value which can be used as the aggregate current limit. For example, if a first current limit associated with the first battery 206 is 50 A and the second current limit associated with the second battery is 60 A, the look-up table component 244 can look up a table indicating that the aggregate limit is 100 A (or any value, depending on the implementation). In some instances, the table can be associated with a battery and provided as, for example, a configuration file. In other instances, the table can be, for example, derived by performing a characterization of a battery. In other instances, the table can be derived by data collection during operation of a battery.

The closed loop component 240 can use real-time data about the one or more batteries, such as, but not limited to, internal impedance data. In some instances, the closed loop component 240 can use a first impedance associated with the first battery unit 204 and a second impedance associated with the second battery unit 210 and calculate an aggregate current limit using the first impedance, the second impedance, the first current limit, and the second current limit. In at least some examples, such current limits may be calculated, for example, in accordance with a current divider model.

As shown in FIG. 2, the vehicle 202 can be configured to use a charging system 246 for charging the first battery 206 and/or the second battery 212 coupled to the vehicle 202. The charging system 246 can include a charge coupler 248 to couple to a corresponding receptacle on the underbody of the vehicle 202. The charge coupler 248 can have a housing 250 which includes electrical contacts 252 and 254. The charge couple can include a cable 256 which is coupled to a power source 258. Additional details of the charging system 246 are discussed in U.S. application Ser. No. 15/837,862 which is herein incorporated by reference.

As shown in FIG. 2, the charging system 246 may also include an anchor 260 associated with the surface on which the charge coupler 248 is positioned and configured to selectively hold the charge coupler 248 in position. In some instances, the charge coupler 248 can be intended to be either portable or fixed in location on the surface, and the anchor 260 can be configured to selectively secure the charge coupler 248 in a fixed position or permit its repositioning using, for example, known securement assemblies, such as fasteners, clamps, etc.

The vehicle 202 can be maneuvered to a position over the charge coupler 248, such that the electrical contacts 252 and 254 of the charge coupler 248 align with contacts attached to the bottom of vehicle 202. The vehicle 202 can be an autonomous vehicle and the charging system 246 can include one or more markers that can be used by the vehicle 202 to maneuver into a substantially aligned position to receive a charge from charging system 246. In at least some examples, the autonomous vehicle may be manually controlled onto such charging platform. The details of such manual control of an autonomous vehicle are discussed in U.S. application Ser. No. 15/833,695 which is herein incorporated by reference.

In some instances, the vehicle 202 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 202 can be configured to control all functions from start to completion of the trip, including all parking functions, it may not include a driver and/or controls for driving the vehicle 202, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

Although the vehicle 202 has four wheels, the systems and methods described herein may be incorporated into vehicles having fewer or a greater number of wheels, tires, and/or tracks. The vehicle 202 can have four-wheel steering and can operate generally with equal performance characteristics in all directions, for example, such that a first end 262 of the vehicle 202 is the front end of the vehicle 202 when travelling in a first direction 264, and such that the first end 262 becomes the rear end of the vehicle 202 when traveling in the opposite, second direction 266, as shown in FIG. 2. Similarly, a second end 268 of the vehicle 202 is the front end of the vehicle 202 when travelling in the second direction 266, and such that the second end 268 becomes the rear end of the vehicle 202 when traveling in the opposite, first direction 264. These example characteristics may facilitate greater maneuverability, for example, in small spaces or crowded environments, such as parking lots and urban areas.

The vehicle 202 may travel through the environment, relying at least in part on sensor data indicative of objects in the environment in order to determine trajectories of the vehicle 202. In some instances, as the vehicle 202 travels through the environment, one or more of the sensors 270 capture data associated with detected objects (e.g., vehicles, pedestrians, buildings, barriers, etc.). The sensors 270 can include image capture devices, LIDAR sensors, SONAR sensors, RADAR sensors, microphones, or the like. The data captured by the sensors 270 can be used, for example, as input for determining trajectories for the vehicle 202.

Figure 3:
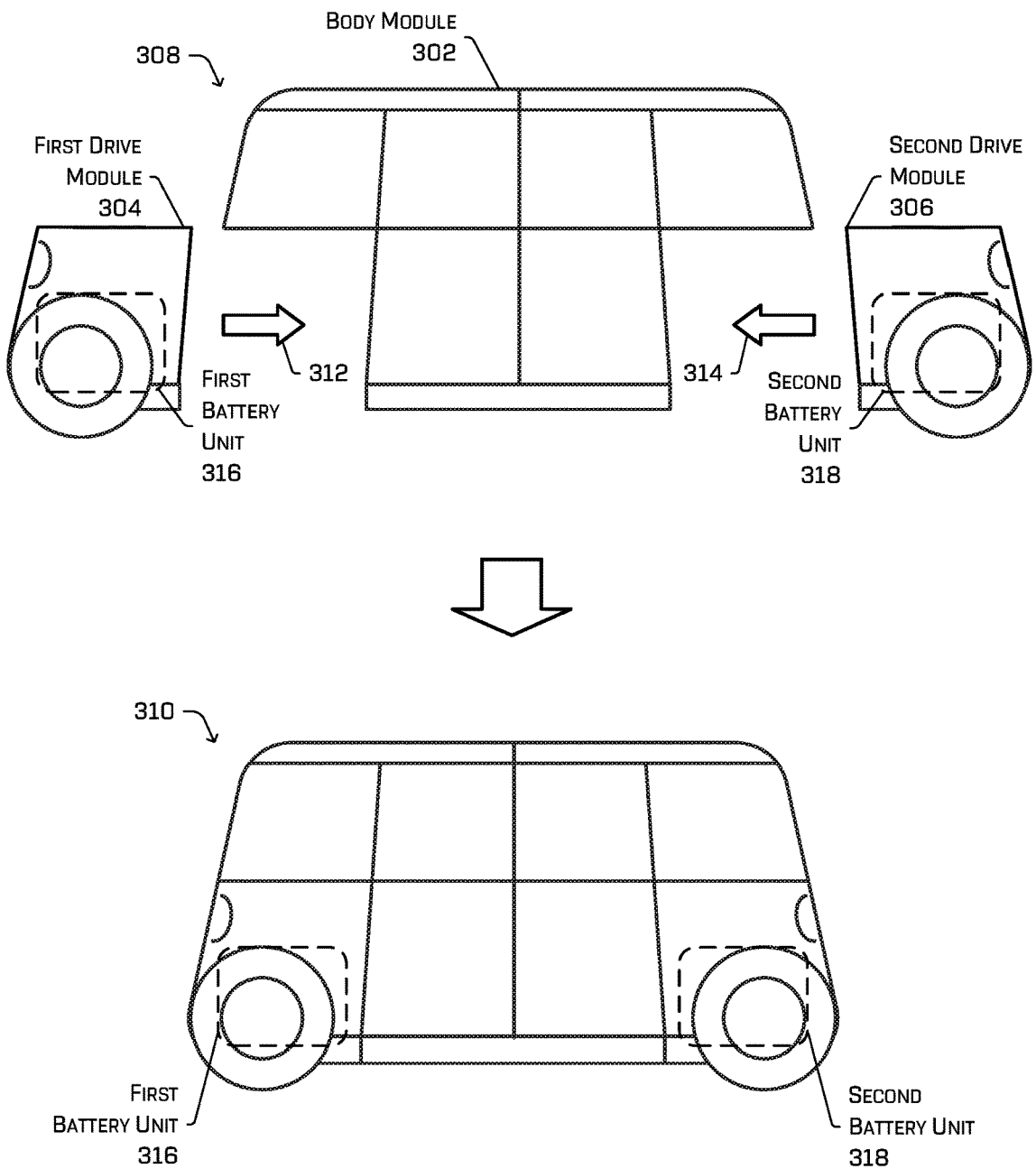
FIG. 3 is a schematic view of an example vehicle comprising a body module, a pair of drive modules disposed at opposite ends of the body module, and a battery unit disposed within or coupled to each drive module.

FIG. 3 is a schematic view of a vehicle 300 comprising a body module (or body unit) 302, a first drive module (or first drive unit) 304 and a second drive module (or second drive unit) 306 disposed at opposite ends of the body module 302. FIG. 3 illustrates the vehicle 300 in an unassembled state 308 and an assembled state 310. In the unassembled state 308, the body module 302 can be supported by supports that are internal or integrated into the vehicle 300, or that are built into a service center, or the like.

During installation, in some instances, the first drive module 304 and the second drive module 306 can be installed by moving them toward the body module 302 in a longitudinal direction of the vehicle 300, as shown by arrows 312 and 314. Upon installing the drive module 304 and 306 with the body module 302, a first battery unit 316 included in the first drive module 304 and a second battery unit 318 included in the second drive module 306 can be electrically coupled via a bus or a controller area network (CAN). In some instances, the first drive module 304 and the second drive module 306 can be installed by moving them towards the body module 302 in a vertical direction (and is not limited to the horizontal coupling illustrated in FIG. 3). Additionally, in some instances, the first drive module 304 and the second drive module 306 can be substantially similar such that they can be interchanged in the body module 302 and continue normal operation. In some instances, the first drive module 304 and the second drive module 306 can be substantially different while having a substantially similar interface. In such an instance, the first drive module 304 and the second drive module 306 can provide different capabilities or limits but can still couple to the body module 302 interchangeably.

Figure 4A:
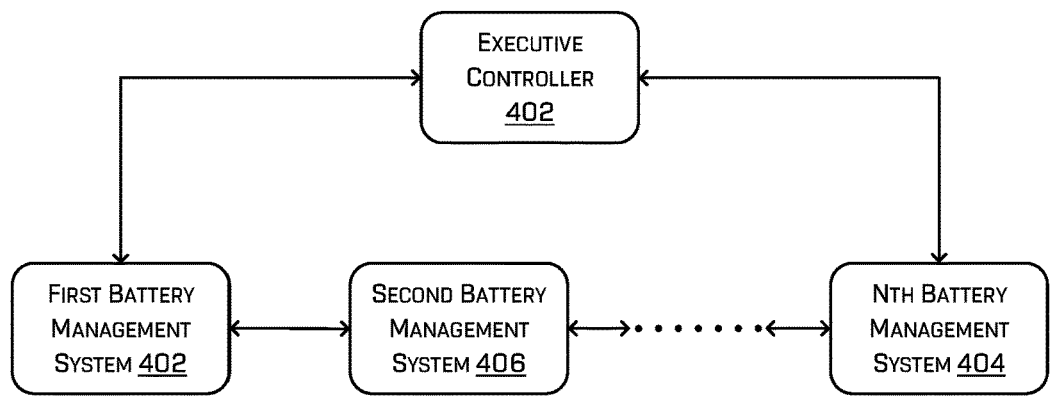
FIG. 4A depicts an example architecture of a redundant BMS architecture using a ring configuration.

FIG. 4A depicts an example architecture of a redundant BMS architecture using a ring configuration or topology 400. In some instances, one or more executive controllers 402 can be coupled to a first battery management system 404 and a last or nth battery management system 404. Though depicted in between the BMSs for illustrative purposes, any one or more of the executive controllers 402 may be interspersed between the BMSs. In such an instance, the executive controller 402 may not be directly coupled to the second battery management system 406. Additionally, this configuration 400 allows for continued operation in the case of particular fault scenarios. In some instances, the system can continue operations if any one coupling between neighboring components is damaged and/or severed. This provides for the system to continue operation, though performance may be degraded, through multiple types of fault conditions. In such a configuration, each BMS may receive limit data and/or physical parameters from other BMSs and calculate one or more aggregate limits to pass on to the one or more ECs 402. In turn, any one or more of the executive controllers 402 may receive the aggregate limits from multiple sources and, in at least some examples, relay individual BMS data to the remaining BMSs along the ring. This figure illustrates an example configuration and other configurations are contemplated. In some instances, the executive controller 402 can be connected to additional battery management systems and not all battery management systems may be coupled to the ring.

Figure 4B:
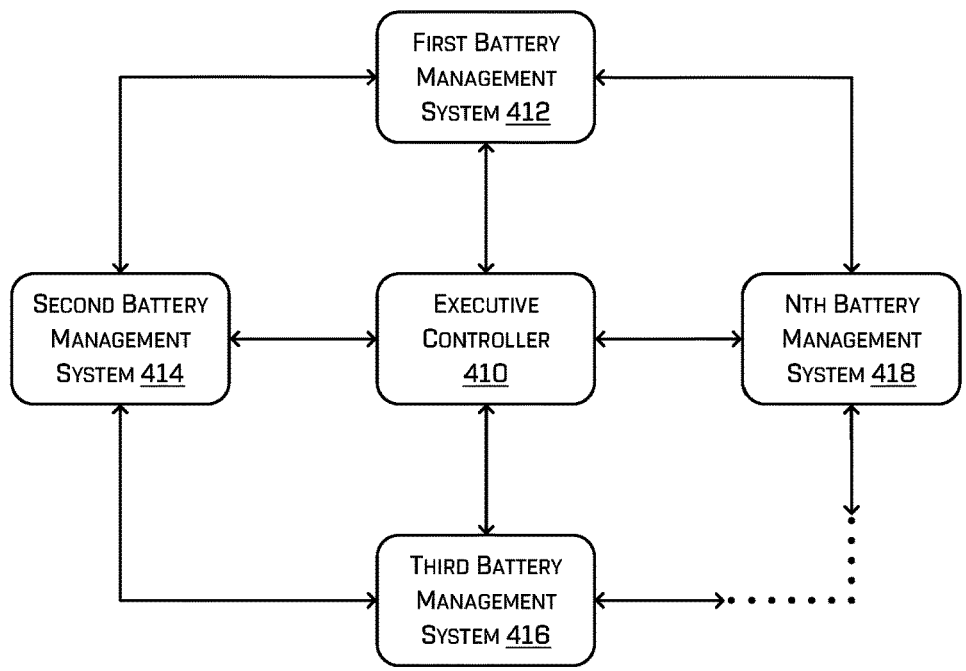
FIG. 4B depicts an example architecture of a redundant BMS architecture using a mesh configuration.

FIG. 4B depicts an example architecture of a redundant BMS architecture using a mesh configuration 408. In some instances, an executive controller 410 can be coupled to a first battery management system 412, a second battery management system 414, a third battery management system 416, and a last or nth battery management system 418. In such an instance, the executive controller 410 can be coupled to every battery management system, with each battery management system being coupled to two other battery management systems. In some instances, the system can continue operations under fault conditions such as damaging or severing N−1 number of couplings of the executive controller 410. For purposes of illustration, if the nth battery management system 418 is the fourth battery management system, the system can continue operation if three of the four couplings to the executive controller 410 are damaged and/or severed. Additionally, the configuration 408 can continue operation through a multitude of damaging or severing of couplings between battery management systems. In such an example, each BMS may relay limit and/or parameter data to at least one or more of the other BMSs, as well as the executive controller 410. Each of the BMSs may, in turn, calculate an aggregate limit to be sent, in turn, to the executive controller 410. This figure illustrates an example configuration and other configurations are contemplated. In some instances, the executive controller 410 may not be connected to every battery management system and only a subset of the available battery management systems. In some instances, the configuration can implement a full mesh topology where the executive controller 410 is coupled to every battery management system and every battery management system is coupled to every other battery management system.

Figure 5:
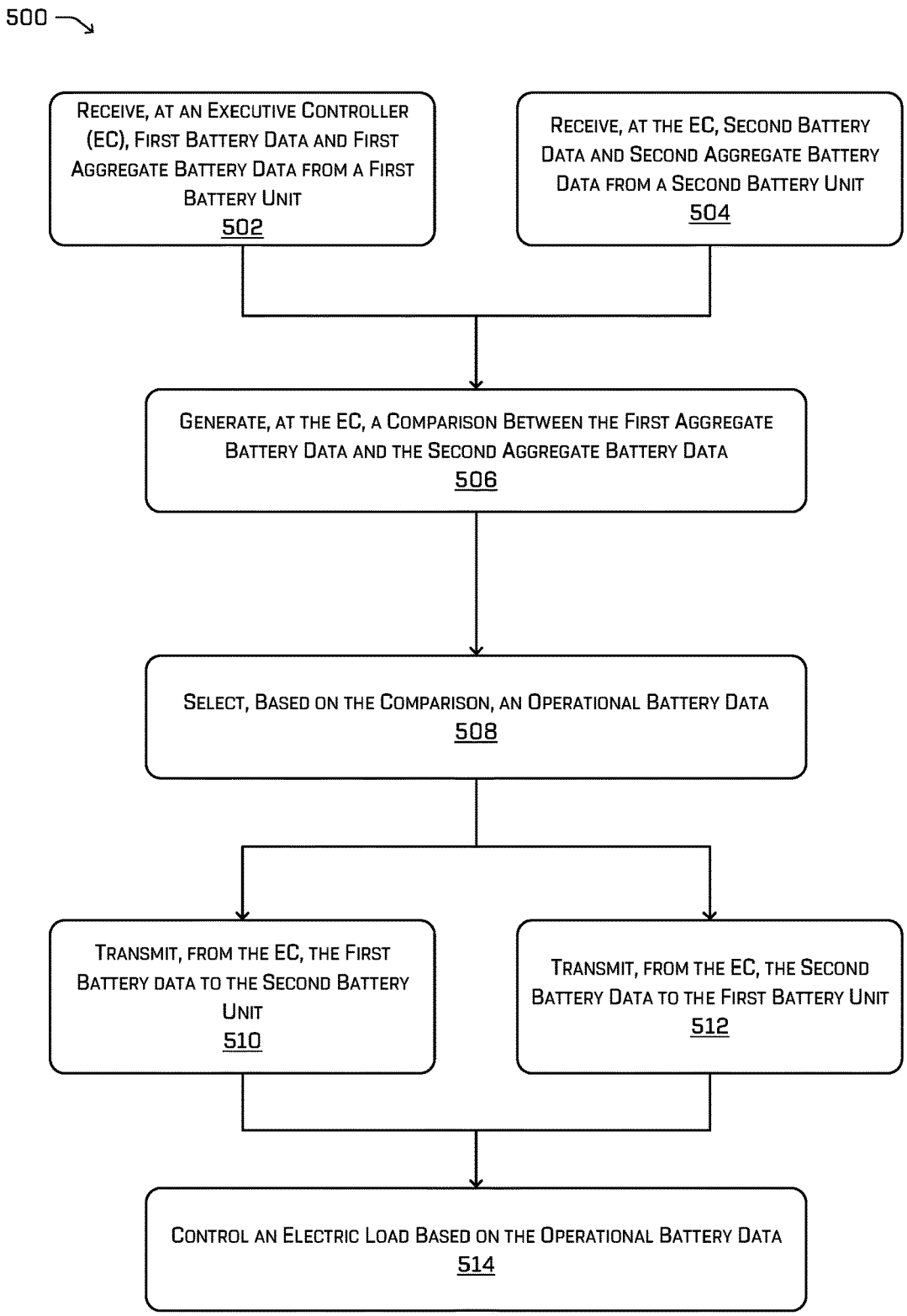
FIG. 5 depicts an example process for receiving battery data and instructing battery units.
Figure 6:
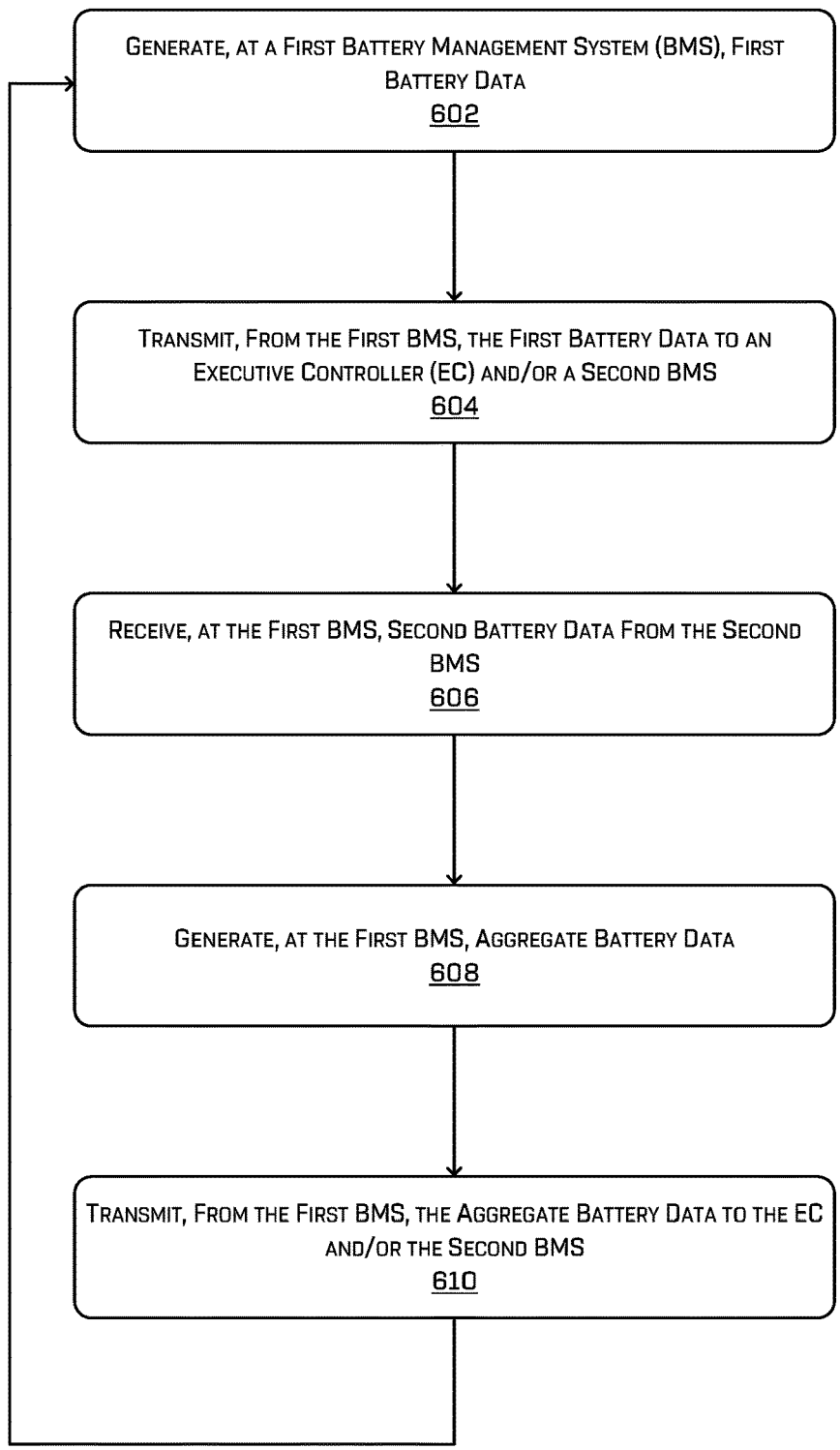
FIG. 6 depicts an example process for generating battery data and transmitting battery data.
Figure 7:
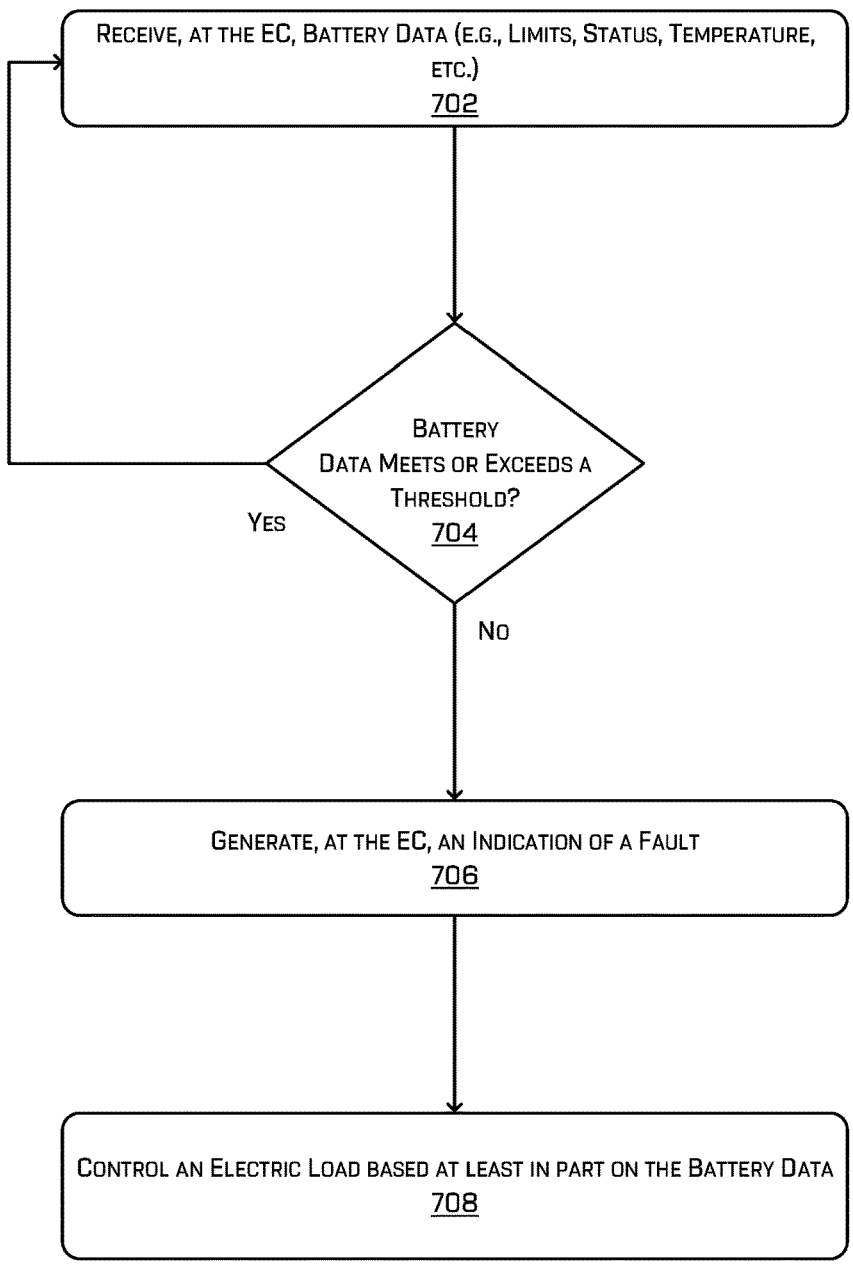
FIG. 7 depicts an example process for determining a fault condition.

FIGS. 5-7 illustrate example processes in accordance with embodiments of the disclosure. These processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

FIG. 5 depicts an example process 500 for receiving battery data and instructing battery units. At operation 502, the process 500 can include receiving, at an executive controller (EC), first battery data and first aggregate battery data from a first battery unit. As discussed above, the EC can be coupled to the first battery unit. In some instances, the first battery data can comprise current limit data, power limit data, voltage limit data, temperature data, connection data, a system state, a battery state, a battery status, and/or impedance data. In some instances, the aggregate battery data can include any combination of data or calculation of data including any of the battery data described herein. At operation 504, the process 500 can include receiving, at the EC, second battery data and second aggregate battery data from a second battery unit. Similarly, as discussed above, the EC can be coupled to the second battery unit. While depicted as operating in parallel (e.g., substantially simultaneously within technical tolerances), operations 502 and 504 can occur serially with either operation 502 or 504 occurring before the other.

At operation 506, the process 500 can include generating, at the EC, a comparison between the first aggregate battery data and the second aggregate battery data. The comparison can indicate whether the first aggregate battery data has a greater value than the second aggregate battery data, or vice versa.

At operation 508, the process 500 can include selecting, based on the comparison, an operational battery data. In some instances, operation 508 selects the lower aggregate battery data (e.g., also referred to as an aggregate battery limit) as the operational battery data (e.g., also referred to as an operational limit). In some instances, operation 508 selects the higher aggregate battery data as the operational battery data. For purposes of illustration, under normal operation, the system may use a conservative setting and select the lower aggregate battery data as the operational battery data. When the aggregate battery data comprises current limits, using the conservative setting and selecting the lower aggregate current limit can reduce the probability of drawing too much current from the batteries and, in turn, reduce the probability of damaging the battery unit, the battery, and/or the battery management system. Additionally, for purposes of illustration, under critical conditions, the system may need an increase in power and may select the higher aggregate battery data as the operational battery data. The higher aggregate battery data can represent an optimistic available power and allow the system to possibly stress the components of the system because of the critical conditions of the environment or otherwise.

At operation 510, the process 500 can include transmitting, from the EC, the first battery data to the second battery unit and at operation 512, transmits, from the EC, the second battery data to the first battery unit. This allows the first battery unit to receive the second battery unit data and the second battery unit to receive the first battery unit data. Similar to operations 502 and 504, while depicted as occurring in parallel, operations 510 and 512 can occur serially with one operation occurring before the other, or vice versa. Additionally, operations 502, 504, 510, and 512 can represent ongoing processes that occur at any frequency. Therefore, in some instances, battery data and aggregate battery data can be continuously transmitted to and from the first battery unit and the second battery unit while the EC can generate comparisons and select operational battery data essentially independently as it receives battery data.

At operation 514, the process 500 can include controlling an electric load based on the operational battery data. As discussed above, the system can provide electrical power to drive modules to maneuver, in some instances, an autonomous vehicle.

FIG. 6 depicts a process 600 for transmitting aggregate battery data from a battery management system, for example, to an executive controller and/or another battery management system. At operation 602, the process 600 can include generating, at a first battery management system (BMS), first battery data. In this process, the first battery management system can refer to the first BMS 104 as described with regard to FIG. 1. At operation 602, the first battery data, as discussed above, can include current limit data, power limit data, voltage limit data, temperature data, connection data, a state, a status, and/or impedance data. The first BMS can also be configured to monitor and/or measure the battery and/or battery unit to generate the battery data.

At operation 604, the process 600 can include transmitting, from the first BMS, the first battery data to an executive controller (EC) and/or a second BMS. The EC can refer to the EC 102 and the second BMS can refer to the second BMS 106, as described with regard to FIG. 1. Additionally, as described in FIG. 1, the first BMS can be coupled to the executive controller and/or the second BMS. The coupling enables the first BMS to transmit the first battery data to either the executive controller or the second BMS.

At operation 606, the process 600 can include receiving, at the first BMS, second battery data from the second BMS. As discussed in FIG. 1, the first BMS can receive the second battery data through a coupling of the first BMS and the second BMS. In some instances, the first BMS can receive the second battery data from the EC.

At operation 608, the process 600 can include generating, at the first BMS, aggregate battery data. The aggregate battery data can include any combination of data or calculation of data including any of the battery data described above. In some instances, the first battery data can include a first current limit and the second battery data can include a second current limit. When generating the aggregate battery data, the first BMS can use the first current limit and the second current limit to generate the aggregate battery data as an aggregate current limit. In some instances, the first aggregate current limit can comprise a sum of the first current limit and the second current limit. In some instances, the first aggregate current limit can comprise a table entry using the first current limit and the second current limit as a lookup key. In some instances, the first aggregate current limit can comprise a dynamic current limit based on observed characteristics of the first and/or second battery such as, but not limited to, an impedance, a slew rate, or an overshoot.

At operation 610, the process 600 can include transmitting, from the first BMS, the aggregate battery data to the EC and/or the second BMS. In some instances, the aggregate battery data can be an aggregate current limit. The first BMS can use the coupling to then transmit the aggregate battery data to the EC and/or to the second BMS. In some instances, the system may have additional controllers and/or battery management systems. In such instances, the first BMS can be configured to transmit the aggregate battery data to a subset of the components in the architecture. In some instances, the first BMS can be configured to broadcast the battery data to every component in the architecture.

FIG. 7 depicts an example process for determining a fault condition. At operation 702, the process 700 can include receiving, at the EC, battery data (e.g., limits, status, temperature, etc.). The battery data can refer to the battery data described, for example, with regard to FIG. 1.

At operation 704, the process 700 can include performing a check to determine if the battery data meets or exceeds a threshold. In some instances, the battery data can, as described above, contain aggregate current data. In order to perform the operations required by the system, a minimum amount of current can be required. In some instances, the aggregate current data can meet or exceed the minimum amount of current required. In such an instance, the process 700 can return to operation 702. If the aggregate current data does not meet or exceed the minimum amount of current required, the process 700 can proceed to operation 706.

At operation 706, the process 700 can include generating, at the EC, an indication of a fault. In some instances, the fault can be an available current lower than an amount of current requested for a particular drive operation. In some instances, the fault can be an available current lower than a preferred current (e.g., if a preferred current includes a built-in safety factor above an amount of requested current). Faults can also include an indication of a damaged or severed coupling as well as other battery data rising above or falling below required or preferred operational thresholds.

At operation 708, the process 700 can include controlling an electric load, for example but not limited to an electric motor, based at least in part on the battery data. In some instances, after detecting a fault and generating an indication of a fault, the system can continue basic operation and provide available power to, for example, an electric motor. In some instances, the operation 708 can allow the system to operate as a fully functional system yet with an indication of a fault wherein the fault is a warning or an indication of a possible future error.

EXAMPLE CLAUSES

A: A system comprising: a first battery unit comprising a first battery and a first battery management system (BMS); a second battery unit comprising a second battery and a second BMS; and a controller communicatively coupled with the first BMS and the second BMS, wherein the controller is configured to perform operations comprising: receiving first battery data and first aggregate limit data from the first BMS; receiving second battery data and second aggregate limit data from the second BMS; determining, based at least in part on the first aggregate limit data and the second aggregate limit data, an operational limit; determining, based at least in part on the operational limit, a torque value of an electric motor; and controlling the electric motor based at least in part on the torque value.

B: The system of paragraph A, wherein the first BMS is communicatively coupled with the second BMS, and wherein the operations further comprise: transmitting the first battery data from the first BMS to the second BMS; and transmitting the second battery data from the second BMS to the first BMS, wherein the first aggregate limit data is determined by the first BMS and based, at least in part, on the first battery data and the second battery data, and wherein the second aggregate limit data is determined by the second BMS and based, at least in part, on the first battery data and the second battery data.

C: The system of paragraph A or B, wherein determining the operational limit comprises: comparing, as a comparison, the first aggregate limit data and the second aggregate limit data; and selecting, based at least in part on the comparison, a lower aggregate limit as the operational limit.

D: The system of any of paragraphs A-C, wherein the first battery data comprises a first current limit or a first power limit associated with the first battery and the second battery data comprises a second current limit or a second power limit associated with the second battery.

E: The system of paragraph D, wherein the first aggregate limit data or the second aggregate limit data comprise at least one of: a combination of the first current limit and the second current limit; a lookup-table entry based at least in part on the first current limit and the second current limit; or a dynamic limit based on observed characteristics of the first battery or the second battery, the observed characteristics comprising at least one of an impedance, a slew rate, or an overshoot.

F: The system of any of paragraphs A-E, wherein the operations further comprise: determining that an observed operating condition is within a range associated with the operational limit, wherein the observed operating condition comprises at least one of a power use, current use, or a voltage use; and determining that a fault condition has occurred, the fault condition indicating that at least one of the first battery unit or the second battery unit is malfunctioning.

G: A method comprising: receiving first battery data and first aggregate limit data from a first battery unit; receiving second battery data and second aggregate limit data from a second battery unit; determining, based at least in part on the first aggregate limit data and the second aggregate limit data, an operational limit; determining, based at least in part on the operational limit, a load value; and controlling, based at least in part on the load value, an electric device.

H: The method of paragraph G, wherein the electric device is a motor, further comprising: determining that the operational limit does not meet or exceed a threshold value; determining that a fault condition has occurred; and controlling the motor to execute a safe stop trajectory for a vehicle.

I: The method of paragraph H, wherein the vehicle comprises an autonomous vehicle.

J: The method of any of paragraphs G-I, further comprising: determining, based at least in part on the first aggregate limit data and the second aggregate limit data, a lower aggregate limit; and selecting the lower aggregate limit.

K: The method of any of paragraphs G-J, further comprising: determining that the first aggregate limit data does not meet or exceed a threshold limit; and determining that the first battery unit is malfunctioning.

L: The method of any of paragraphs G-K, further comprising: transmitting a portion of the first battery data to the second battery unit.

M: The method of any of paragraphs G-L, wherein the first battery data comprises at least one of: current limit data; power limit data; voltage limit data; temperature data; connection data; a battery operational state; a system operational state; or a battery status.

N: A non-transitory computer-readable medium storing instructions executable by a processor, wherein the instructions, when executed, cause the processor to perform operations comprising: receiving, at a controller, first battery data from a first battery unit; receiving, at the controller, second battery data from a second battery unit; determining, based at least in part on the first battery data and the second battery data, an operational limit; determining, based at least in part on the operational limit, a load value of an electric component; and controlling, based at least in part on the load value, the electric component.

O: The non-transitory computer-readable medium of paragraph N, wherein the instructions, when executed, further cause the processor to perform operations comprising: receiving, at the controller, a first aggregate limit data from the first battery unit and a second aggregate limit data from the second battery unit; determining, based at least in part on the first aggregate limit data and the second aggregate limit data, a lower aggregate battery limit; and selecting the lower aggregate battery limit.

P: The non-transitory computer-readable medium of paragraph O, wherein the first aggregate limit comprises at least one of: a combination of the first aggregate limit data and the second aggregate limit data; a lookup-table entry based at least in part on the first aggregate limit data and the second aggregate limit data; or a dynamic limit based at least in part on observed characteristics of the first battery unit or the second battery unit, the observed characteristics comprising at least one of an impedance, a slew rate, or an overshoot.

Q: The non-transitory computer-readable medium of any of paragraphs N-P, wherein the instructions, when executed, further cause the processor to perform operations comprising: generating, based at least in part on the first battery data and the second battery data, an aggregate battery limit.

R: The non-transitory computer-readable medium of any of paragraphs N-Q, wherein the instructions, when executed, further cause the processor to perform operations comprising: receiving, at the controller, first aggregate limit data from the first battery unit and second aggregate limit data from the second battery unit; determining that a difference between the first aggregate limit data and the second aggregate limit data meets or exceeds a difference threshold; and determining a failure of a first coupling between the first battery unit and the controller or a second coupling between the second battery unit and the controller.

S: The non-transitory computer-readable medium of any of paragraphs N-R, wherein the instructions, when executed, further cause the processor to perform operations comprising; determining, based at least in part on the first battery data or the second battery data, that a fault condition has occurred, the fault condition comprising at least one of: a current fault; a power fault; a voltage fault; or a temperature fault.

T: The non-transitory computer-readable medium of any of paragraphs N-S, wherein the instructions, when executed, further cause the processor to perform operations comprising: transmitting a portion of the first battery data to the second battery unit; and transmitting a portion of the second battery data to the first battery unit.

While the example clauses described above are described with respect to one particular implementation, it should be understood that, in the context of this document, the content of the example clauses can also be implemented via a method, device, system, a computer-readable medium, and/or another implementation.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A method comprising:
receiving, from a first battery unit, first battery data;
receiving, from a second battery unit, second battery data;
determining, based at least in part on the first battery data and the second battery data, aggregate limit data comprising at least one of:
a combination of the first battery data and the second battery data;
a lookup-table entry based at least in part on the first battery data and the second battery data; or
a dynamic limit based at least in part on observed characteristics of the first battery unit or the second battery unit, the observed characteristics comprising at least one of an impedance, a slew rate, or an overshoot;
determining, based at least in part on the aggregate limit data, an operational limit; and
controlling, based at least in part on the operational limit, an electric device.

2. The method of claim 1, wherein the electric device is a motor, the method further comprising:
determining, based on the operational limit, a torque value associated with the motor.

3. The method of claim 1, wherein the electric device is a motor, the method further comprising:
determining that the operational limit does not meet or exceed a threshold value;
determining that a fault condition has occurred; and
controlling the motor to execute a safe stop trajectory for a vehicle.

4. The method of claim 1, further comprising:
determining that the first battery data does not meet or exceed a threshold value; and
determining that the first battery unit is malfunctioning.

5. The method of claim 1, wherein the first battery data comprises first limit data and the second battery data comprises second limit data, the method further comprising:
determining that a difference between the first limit data and the second limit data meets or exceeds a difference threshold; and
determining a failure of a first coupling between the first battery unit and a controller or a second coupling between the second battery unit and the controller.

6. The method of claim 1, further comprising:
transmitting, to the second battery unit, at least a portion of the first battery data.

7. The method of claim 1, wherein the first battery data comprises at least one of:
current limit data;
power limit data;
voltage limit data;
temperature data;
connection data;
a battery operational state;
a system operational state; or
a battery status.

8. A system comprising:
one or more processors; and
one or more non-transitory computer readable media storing computer executable instructions that, when executed, cause the one or more processors to perform operations comprising:
receiving, from a first battery unit, first battery data;
receiving, from a second battery unit, second battery data;
determining, based at least in part on the first battery data and the second battery-data, aggregate limit data comprising at least one of:
a combination of the first battery data and the second battery data;
a lookup-table entry based at least in part on the first battery data and the second battery data; or
a dynamic limit based at least in part on observed characteristics of the first battery unit or the second battery unit, the observed characteristics comprising at least one of an impedance, a slew rate, or an overshoot;
determining, based at least in part on the aggregate limit data, an operational limit; and
controlling, based at least in part on the operational limit, an electric device.

9. The system of claim 8, wherein the electric device is a motor, the operations further comprising:
determining, based on the operational limit, a torque value associated with the motor.

10. The system of claim 8, wherein the electric device is a motor, the operations further comprising:
determining that the operational limit does not meet or exceed a threshold value;
determining that a fault condition has occurred; and
controlling the motor to execute a safe stop trajectory for a vehicle.

11. The system of claim 10, wherein the vehicle is an autonomous vehicle.

12. The system of claim 8, wherein the first battery data comprises limit data, the operations further comprising:
determining that the limit data does not meet or exceed a threshold value; and
determining that the first battery unit is malfunctioning.

13. One or more non-transitory computer-readable media storing instructions executable by one or more processors, wherein the instructions, when executed, cause the one or more processors to perform operations comprising:

receiving, from a first battery unit, first battery data;

receiving, from a second battery unit, second battery data;

determining, based at least in part on the first battery data and the second battery-data, aggregate limit data comprising at least one of:

a combination of the first battery data and the second battery data;

a lookup-table entry based at least in part on the first battery data and the second battery data; or a dynamic limit based at least in part on observed characteristics of the first battery unit or the second battery unit, the observed characteristics comprising at least one of an impedance, a slew rate, or an overshoot;

determining, based at least in part on the aggregate limit data, an operational limit; and controlling, based at least in part on the operational limit, an electric device.

14. The one or more non-transitory computer-readable media of claim 13, wherein the electric device is a motor, the operations further comprising:

determining, based on the operational limit, a torque value associated with the motor.

15. The one or more non-transitory computer-readable media of claim 13, wherein the electric device is a motor, the operations further comprising:

determining that the operational limit does not meet or exceed a threshold value;

determining that a fault condition has occurred; and controlling the motor to execute a safe stop trajectory for a vehicle.

16. The one or more non-transitory computer-readable media of claim 13, wherein the first battery data comprises limit data, the operations further comprising:

determining that the limit data does not meet or exceed a threshold value; and determining that the first battery unit is malfunctioning.

17. The one or more non-transitory computer-readable media of claim 13, wherein the first battery data comprises first limit data and the second battery data comprises second limit data, the operations further comprising:

determining that a difference between the first limit data and the second limit data meets or exceeds a difference threshold; and determining a failure of a first coupling between the first battery unit and a controller or a second coupling between the second battery unit and the controller.

* * * * *